United States Patent
Abe et al.

(10) Patent No.: US 7,719,818 B2
(45) Date of Patent: May 18, 2010

(54) MATERIAL FOR FORMING CAPACITOR LAYER AND METHOD FOR MANUFACTURING THE MATERIAL FOR FORMING CAPACITOR LAYER

(75) Inventors: Naohiko Abe, Ageo (JP); Akiko Sugioka, Ageo (JP); Akihiro Kanno, Ageo (JP); Hirotake Nakashima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 430 days.

(21) Appl. No.: 11/912,716

(22) PCT Filed: Apr. 28, 2006

(86) PCT No.: PCT/JP2006/308956

§ 371 (c)(1),
(2), (4) Date: Oct. 26, 2007

(87) PCT Pub. No.: WO2006/118237

PCT Pub. Date: Nov. 9, 2006

(65) Prior Publication Data

US 2008/0283283 A1 Nov. 20, 2008

(30) Foreign Application Priority Data

Apr. 28, 2005 (JP) ............................. 2005-133693

(51) Int. Cl.
*H01G 4/22* (2006.01)
*H01G 4/20* (2006.01)
*H01G 4/005* (2006.01)

(52) U.S. Cl. .................... 361/314; 361/320; 361/303

(58) Field of Classification Search ................. 361/311, 361/303, 314, 315, 318–319, 323, 317
See application file for complete search history.

(56) References Cited

U.S. PATENT DOCUMENTS 5,116,663 A * 5/1992 Fujimoto et al. ............ 428/209

(Continued)

FOREIGN PATENT DOCUMENTS

JP 6140385 A 5/1994

(Continued)

OTHER PUBLICATIONS

Written Opinion of the International Searching Authority for application PCT/JP2006/308956.*

Primary Examiner—Eric Thomas
(74) Attorney, Agent, or Firm—Rothwell, Figg, Ernst & Manbeck, P.C.

(57) ABSTRACT

An object of the present invention is to provide a material for forming a capacitor layer comprising a dielectric layer formed by any one of a sol-gel method, an MOCVD method, and a sputtering deposition method. The material can reduce a leakage current of a capacitor circuit. In order to achieve the object, a material for forming a capacitor layer comprising a dielectric layer between a first conductive layer to be used for forming a top electrode and a second conductive layer to be used for forming a bottom electrode, characterized in that the dielectric layer is a dielectric oxide film formed by any one of a sol-gel method, an MOCVD method, and a sputtering deposition method; and particles constituting the dielectric oxide film are impregnated with a resin component is employed. In addition, a manufacturing method characterized in that the dielectric oxide film is formed on the surface of a material to be the bottom electrode by any one of a sol-gel method, an MOCVD method, and a sputtering deposition method; a resin varnish is impregnated into a surface of the dielectric oxide film; the resin is dried and cured to form the dielectric layer; and then a top electrode constituting layer is provided on the dielectric layer is employed.

11 Claims, 1 Drawing Sheet

U.S. PATENT DOCUMENTS

| | | |
|---|---|---|
| 6,212,057 B1 | 4/2001 | Kohara et al. |
| 6,573,584 B1 | 6/2003 | Nagakari et al. |
| 2003/0224568 A1* | 12/2003 | Toyoshima et al. ......... 438/240 |
| 2004/0109298 A1* | 6/2004 | Hartman et al. ............. 361/762 |

FOREIGN PATENT DOCUMENTS

| JP | 7-294862 A | 11/1995 |
|---|---|---|
| JP | 2001358303 A | 12/2001 |
| JP | 2002539634 A | 11/2002 |

* cited by examiner

MATERIAL FOR FORMING CAPACITOR LAYER AND METHOD FOR MANUFACTURING THE MATERIAL FOR FORMING CAPACITOR LAYER

CROSS REFERENCE TO RELATED APPLICATION

This application is a 35 U.S.C. 371 National Phase Entry Application from PCT/JP2006/308956, filed Apr. 28, 2006, which claims the benefit of Japanese Patent Application No. 2005-133693 filed on Apr. 28, 2005 in the Japanese Intellectual Property Office, the disclosure of which is incorporated herein in its entirety by reference.

TECHNICAL FIELD

The present invention relates to a material for forming a capacitor layer, a method for manufacturing the material for forming a capacitor layer, and a printed wiring board comprising an embedded capacitor layer obtained by using the material for forming a capacitor layer.

BACKGROUND ART

The material for forming a capacitor layer according to the present invention comprises a dielectric layer between a first conductive layer to be used for forming a top electrode and a second conductive layer to be used for forming a bottom electrode. Then the first conductive layer and the second conductive layer are processed by etching or the like to form a capacitor circuit. As disclosed in Patent Document 1, the material for forming a capacitor layer is typically used as a material for constituting electronic devices such as printed wiring boards.

The dielectric layer is a material to perform insulating properties and to store certain amounts of electric charges. Various methods are used to form such dielectric layers. In those, a chemical vapor deposition method (CVD method), a sputtering deposition method, and a sol-gel method are popular. For example, Patent Document 2 discloses a method for manufacturing the dielectric layer by the chemical vapor deposition method comprising a step of depositing an amorphous $SrTiO_3$ thin film on a substrate at a temperature less than 400° C.; and a step of subjecting the amorphous $SrTiO_3$ thin film to laser annealing or rapid thermal annealing to crystallize the film to obtain a $SrTiO_3$ thin film. The dielectric layer is obtained by this method for the purpose of obtaining a $SrTiO_3$ thin film having a high dielectric constant.

As for a dielectric layer obtained by the sputtering deposition method, Patent Document 3 discloses a thin film capacitor in which a bottom electrode, a dielectric having a high dielectric constant, and a top electrode are stacked on an arbitrarily layer on a substrate. The thin film capacitor is characterized in that the dielectric having a high dielectric constant is a polycrystal composed of crystal grains and grain boundaries; the polycrystal contains metallic ions capable of having multiple valences as impurities; and the impurities are contained in a higher concentration in the vicinity of the grain boundaries than in the crystal grains of the polycrystal. Patent Document 3 also discloses that the metallic ions capable of having multiple valences are preferably Mn ions. Patent Document 3 describes that thin film capacitors obtained by the method have higher long-term reliability and take a long time for dielectric breakdown.

As for a dielectric layer obtained by the sol-gel method, Patent Document 4 discloses a method for manufacturing a dielectric oxide thin film in which a surface of a substrate is subjected to a hydroxylation treatment and then the dielectric oxide thin film made of metal alkoxide is formed on the substrate. Patent Document 4 describes that a dielectric oxide that can be used for forming the thin film is a metal oxide having the dielectric characteristics such as $LiNbO_3$, $Li_2B_4O_7$, $PbZrTiO_3$, $BaTiO_3$, $SrTiO_3$, $PbLaZrTiO_3$, $LiTaO_3$, $ZnO$, or $Ta_2O_5$. Patent Document 4 describes that dielectric oxide thin films obtained by the method are excellent in both orientation and crystallinity.

In particular, the formation of a dielectric layer by the sol-gel method disclosed in Patent Document 4 has advantages in comparison with the formation of a dielectric layer by the chemical vapor deposition method (CVD method) or the sputtering deposition method. The advantages are that investments for equipment are not required because vacuum processes are not used and the dielectric layer is easily formed on a substrate having a large area. In addition, it is easy to control the components of the dielectric layer to be in theoretical proportions, and an extremely thin dielectric layer can be obtained. Therefore, the dielectric layer obtained by the sol-gel method is expected to be a material for forming a capacitor layer with large capacitance.

Patent Document 1: National Publication of International Patent Application No. 2002-539634
Patent Document 2: Japanese Patent Laid-Open No. 06-140385
Patent Document 3: Japanese Patent Laid-Open No. 2001-358303
Patent Document 4: Japanese Patent Laid-Open No. 07-294862

However, the dielectric layers obtained by the sol-gel method, the MOCVD method or the sputtering deposition method have some problems, occurrence of a short circuit across a top electrode and a bottom electrode and occurrence of a large leakage current after formation of a capacitor due to its thin thickness of the layer because of uneven film thickness and gaps between oxide particles which result low production yields. Particularly when the areas of electrodes are widened to increase the capacitance of a capacitor, defective products with short circuit may be frequently produced.

In general, capacitor circuits have realized power savings of electronic and electrical equipment and the like by storing excess electricity or the like. Therefore, the capacitor circuits are required to have a capacitance as large as possible, which is a basic requirement on quality. The capacitance (C) of a capacitor is calculated with the formula $C=\varepsilon \cdot \varepsilon_0 (A/d)$ ($\varepsilon_0$ is a dielectric constant of vacuum). In particular, there has been a recent trend of down sizing of electronic and electrical equipment, and thus down sizing is also demanded for printed wiring boards. Even though a large surface area (A) is allocated for a capacitor electrode in a certain surface area of a printed wiring board or the like, capacitor circuits may be required to have a larger capacitance.

Consequently, a material for forming a capacitor layer comprising a dielectric layer formed by any one of a sol-gel method, an MOCVD method, and a sputtering deposition method which enables manufacturing of the capacitor circuits with large capacitance in high production yields has been required in the market.

DISCLOSURE OF THE INVENTION

Then the present inventors have thoroughly tried approaches to make oxide crystal grains of a dielectric layer formed by the sol-gel method or the like to obtain such grains as the finest sizes ever, or conversely coarse one having few grain boundaries. As a result, the inventors have achieved the following invention.

Material for forming capacitor layer according to the present invention: the basic construction of the material for forming a capacitor layer according to the present invention is comprising a dielectric layer between a first conductive layer to be used for forming a top electrode and a second conductive layer to be used for forming a bottom electrode, characterized in that the dielectric layer is a dielectric oxide film formed by any one of a sol-gel method, an MOCVD method, and a sputtering deposition method; and a resin component are impregnated between particles constituting the dielectric oxide film.

The dielectric oxide film constituting the dielectric layer preferably comprises 0.01 mol % to 5.00 mol % of one or more selected from manganese, silicon, nickel, aluminum, lanthanum, niobium, magnesium, and tin.

The dielectric layer of the material for forming a capacitor layer according to the present invention preferably has a thickness of 20 nm to 1-micron meter.

The dielectric oxide film constituting the material for forming a capacitor layer according to the present invention is preferably a $(Ba_{1-x}Sr_x)TiO3$ ($0<=x<=1$) film or a $BiZrO_3$ film.

The second conductive layer of the material for forming a capacitor layer according to the present invention is preferably a nickel layer or a nickel alloy layer having a thickness of 1-micron meter to 100-micron meter.

The nickel alloy layer is preferred to be a nickel-phosphorus alloy.

Method for manufacturing the material for forming a capacitor layer according to the present invention: the method for manufacturing the material for forming a capacitor layer according to the present invention is characterized in that the dielectric oxide film is formed on a surface of the material to be the bottom electrode by any one of a sol-gel method, an MOCVD method, and a sputtering deposition method; a resin varnish is coated on a surface of the dielectric oxide film to be impregnated into the dielectric oxide film; the resin is dried and cured to form the dielectric layer; and then a top electrode constituting layer is provided on the dielectric layer.

When the dielectric oxide film is formed by the sol-gel method, the film is preferably obtained through the following processes (A) to (D).

(A) a solution preparation process of preparing a sol-gel solution for manufacturing an aiming dielectric oxide film;

(B) a coating process of adjusting a film thickness by repeating a unit step twice or more times where the unit step comprises a sequential stages: coating the sol-gel solution on a surface of a metal foil to be the second conductive layer followed by drying the solution in an oxygen-containing atmosphere at 120° C. to 250° C. for 30 seconds to 10 minutes followed by subjecting the dried solution to pyrolysis in an oxygen-containing atmosphere at 270° C. to 390° C. for 5 minutes to 30 minutes;

(C) a baking process of conducting a baking treatment at 550° C. to 800° C. for 5 minutes to 60 minutes in an inert-gas substituted atmosphere or in a vacuum atmosphere to finish the dielectric layer; and (D) a first conductive layer forming process of forming a first conductive layer on the obtained dielectric layer to provide a material for forming a capacitor layer.

When the dielectric oxide film is formed by the sol-gel method, the film is also preferably obtained through the following processes (a) to (d).

(a) a solution preparation process of preparing a sol-gel solution for manufacturing an aiming dielectric oxide film;

(b) a coating process of adjusting a film thickness by repeating a unit step twice or more times and arbitrarily conducting a pre-baking treatment among the unit steps wherein the unit step comprises a sequential stages: coating the sol-gel solution on a surface of a metal foil to be the second conductive layer followed by drying the solution in an oxygen-containing atmosphere at 120° C. to 250° C. for 30 seconds to 10 minutes followed by subjecting the dried solution to pyrolysis in an oxygen-containing atmosphere at 270° C. to 390° C. for 5 minutes to 30 minutes; the pre-baking treatment is conducted at 550° C. to 800° C. for 2 minutes to 60 minutes in an inert-gas substituted atmosphere or in a vacuum atmosphere; then (c) a baking process of conducting a baking treatment at 550° C. to 800° C. for 5 minutes to 60 minutes in an inert-gas substituted atmosphere or in a vacuum atmosphere to finish the dielectric layer; and (d) a first conductive layer forming process of forming a first conductive layer on the obtained dielectric layer to provide a material for forming a capacitor layer.

In manufacturing of the material for forming a capacitor layer according to the present invention, the resin varnish coated on a surface of the dielectric oxide film is preferably a dilute resin varnish having a soli content of 0.1 wt % to 1.0 wt % against 100 wt % weight of the resin varnish.

Printed wiring board formed with the material for forming a capacitor layer according to the present invention: the material for forming a capacitor layer according to the present invention is preferably used for forming an embedded capacitor layer of a multilayer printed wiring board.

The material for forming a capacitor layer according to the present invention achieves reduction of both occurrence of short circuit failures and a leakage current across a top electrode and a bottom electrode by impregnating a dielectric layer between a first conductive layer and a second conductive layer with a resin component. When the material for forming a capacitor layer is used as a capacitor, the material exhibits large capacitance and low dielectric loss. The dielectric layer performs its characteristics particularly when the dielectric layer is a dielectric oxide film formed by any one of a sol-gel method, an MOCVD method, and a sputtering deposition method. Furthermore, use of the method for manufacturing the material for forming a capacitor layer according to the present invention makes it possible to reduce a leakage current of a dielectric layer formed by the sol-gel method, the MOCVD method, or the sputtering deposition method and to efficiently manufacture materials for forming a capacitor layer having excellent dielectric characteristics.

DESCRIPTION OF SYMBOLS

Figure 1:
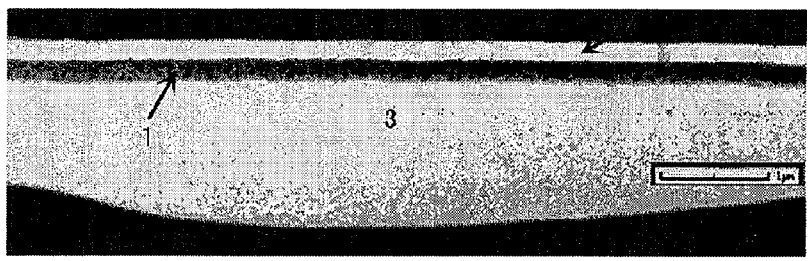
FIG. 1 is a FIB-SIM image of a cross section of a dielectric layer which is impregnated with a resin varnish having a proper solid content of 0.3 wt %.

1 Dielectric layer
2 Top electrode
3 Bottom electrode
4 Resin film

BEST MODE FOR CARRYING OUT THE INVENTION

Embodiment of Material for Forming a Capacitor Layer According to the Present Invention The basic construction of the material for forming a capacitor layer according to the present invention is as follows: a material for forming a capacitor layer comprising a dielectric layer between a first conductive layer to be used for forming a top electrode and a second conductive layer to be used for forming a bottom electrode, characterized in that the dielectric layer is a dielectric oxide film formed by any one of a sol-gel method, an MOCVD method, and a sputtering deposition method; and particles constituting the dielectric oxide film is impregnated with a resin component.

Dielectric layer: The dielectric layer of the material for forming a capacitor layer is required to have a large capacitance for storing large charges. A smaller leakage current that is discharge of stored electric charges is more preferable. Then the present inventors have examined a tendency and a mechanism of generation of a leakage current on formed capacitor circuits with materials for forming a capacitor layer having constructions as with materials according to the present invention. As a result, they have found that when a dielectric layer is a dielectric oxide film formed by the sol-gel method, a leakage current tends to pass through grain boundaries and structural defects of the dielectric oxide film. More specifically, a leakage current increases with a fine structure of the dielectric oxide film and large amount of grain boundaries. On the other hand, they have found that when a dielectric oxide film has a certain degree of a coarse structure and few grain boundaries, a leakage current is small and such a dielectric oxide film performs as a dielectric layer having a large capacitance.

In particular, dielectric oxide films formed by any one of a sol-gel method, an MOCVD method, and a sputtering deposition method under popular conditions have many structural defects in the crystal structures. Therefore, it is difficult to make the structures of such dielectric oxide films coarse to a certain degree and to achieve the state of few grain boundaries. Then the present inventors have conceived the idea of impregnating a dielectric oxide film formed by any one of a sol-gel method, an MOCVD method, and a sputtering deposition method with a resin component to fill structural defects that may be passages of leakage currents. It should be noted that use of the method for manufacturing the material for forming a capacitor layer according to the present invention described later makes it possible to form dielectric layers having crystal grains that are coarse to some degree. Such a case is preferable because a synergistic effect is achieved with the resin impregnation.

Any one of a sol-gel method, an MOCVD method, and a sputtering deposition method may be used to form the dielectric layers as long as $(Ba_{1-x}Sr_x)TiO3$ ($0 \leq x \leq 1$) films or $BiZrO_3$ films are obtained as aimed dielectric oxide films. It should be noted that the $(Ba_{1-x}Sr_x)TiO3$ ($0 \leq x \leq 1$) film represents $BaTiO_3$ composition when $x=0$, and represents $SrTiO_3$ composition when $x=1$. Between the compositions, there are mid-compositions such as $(Ba_{0.7}Sr_{0.3})TiO3$.

Resin Component: As the resin component, resin compositions containing epoxy resins are preferably used as their main component. It is particularly preferable to use a resin composition containing 40 wt % to 70 wt % of an epoxy resin, 20 wt % to 50 wt % of a polyvinyl acetal resin, 0.1 wt % to 20 wt % of a melamine resin or a urethane resin against to the total amounts of resin components, in which 5 wt % to 80 wt % of the epoxy resin is a rubber modified epoxy resin.

The epoxy resins used herein may be any commercially available resins for forming laminates, electronic parts, or the like without restriction. Examples of the epoxy resins may include: bisphenol-A epoxy resins, bisphenol-F epoxy resins, novolac epoxy resins, o-cresol novolac epoxy resins, glycidyl amine compounds such as triglycidyl isocyanurate or N,N-diglycidyl aniline, glycidyl ester compounds such as diglycidyl tetrahydrophthalate, and brominated epoxy resins such as tetrabromobisphenol-A diglycidyl ether. These epoxy resins are preferably used alone or by mixing. Degree of polymerization and epoxy equivalent of the epoxy resins are not particularly restricted.

The "hardener" for the epoxy resins may be dicyandiamide, organic hydrazides, imidazoles, amines such as aromatic amines, phenols such as bisphenol A or brominated bisphenol A, novolacs such as phenol novolac resins or creosol novolac resins, acid anhydrides such as phthalic anhydride. The hardeners may be used alone or by mixing. The amount of a hardener to be added to an epoxy resin is determined against equivalent amounts of the hardener to the epoxy resin itself. Therefore, it is considered that a specific blending ratio of the hardener is not required to be described. Thus, the present invention does not particularly restrict the amount of a hardener to be added.

Furthermore, a curing accelerator may optionally be added in proper amounts. As the curing accelerator, tertiary amines, imidazole curing accelerators, and urea curing accelerators and the like can be used. The present invention does not particularly restrict the blending ratio of the curing accelerator. This is because manufacturers can arbitrarily and selectively determine the amount of the curing accelerator to be added in consideration of manufacturing conditions for manufacturing processes of dielectric layers.

A preferred amount of the epoxy resin blended in the resin composition is 40 wt % to 70 wt % against to the total resin components. When the blended amount is less than 40 wt %, insulating properties as electrical characteristics and heat resistance are deteriorated. On the other hand, when more than 70 wt % of the epoxy resin is blended, resin flow in curing may be so large to show tendency of uneven distribution of resin components in a dielectric layer.

A rubber modified epoxy resin is preferably used as a part of the epoxy resin composition. Commercially available rubber modified epoxy resins for adhesives or paints may be used without particular limitation. Examples thereof may include "EPICLON TSR-960" (trade name, manufactured by Dainippon Ink and Chemicals Incorporated), "EPOTOHTO YR-102" (trade name, manufactured by Tohto Kasei Co., Ltd.), "SUMIEPOXY ESC-500" (trade name, manufactured by Sumitomo Chemical Co., Ltd.), "EPOMIK VSR 3531" (trade name, manufactured by Mitsui Petrochemical Industries, Ltd.), and the like. These rubber modified epoxy resins may be used alone or by mixing. The blending ratio of the rubber modified epoxy resin herein is 5 wt % to 80 wt % of the total amounts of epoxy resins. Use of a rubber modified epoxy resin promotes fixing of resin components in the dielectric layer. Therefore, when the additional amount of the rubber modified epoxy resin is less than 5 wt %, the effect of promoting fixing of resin components in the dielectric layer is not obtained. On the other hand, when the additional amount of the rubber modified epoxy resin is greater than 80 wt %, the cured resin may have poor heat resistance.

A polyvinyl acetal resin used for the resin component is synthesized by a reaction of a polyvinyl alcohol and aldehydes. Polyvinyl acetal resins for paints or adhesives are commercially available at present such as reaction products of polyvinyl alcohols having various degrees of polymerization and one or more types of aldehydes. Polyvinyl acetal resins may be used in the present invention without particularly limiting types of aldehydes or degree of acetalization. A degree of polymerization of a polyvinyl alcohol as the material is not particularly restricted. However, products synthesized from polyvinyl alcohols with degrees of polymerization of 2000 to 3500 are preferably used in consideration of heat resistance of cured resins or solubility in solvents. Furthermore, modified polyvinyl acetal resins in which carboxyl groups or the like are introduced intramolecularly which is also commercially available may be used without particular limitation as long as the resins do not cause problems in compatibility with an epoxy resin to be combined. The amount of the polyvinyl acetal resin to be added to an insulating layer is 20 wt % to 50 wt % against the total amounts of the resin composition. When the additional amount is less than 20 wt %, an effect of improving flow ability of resins cannot be obtained. On the other hand, when the additional amount is greater than 50 wt %, a cured insulating layer has higher water absorption, which is extremely undesired as a component of a dielectric layer.

In addition to the components mentioned above, the resin composition used in the present invention preferably contains a melamine resin or a urethane resin as a cross-linking agent for the polyvinyl acetal resins. The melamine resin used herein may be commercially available alkylated melamine resins for paints. Examples thereof may include: methylated melamine resins, n-butylated melamine resins, iso-butylated melamine resins, and alkylated melamine resins combining thereof. Molecular weights or degrees of alkylation of the melamine resins are not particularly restricted.

As the urethane resin, resins including isocyanate functions in a molecule and are commercially available for adhesives or paints may be used. Examples thereof may include: reaction products of polyisocyanate compounds such as tolylene diisocyanate, diphenylmethane diisocyanate, or polymethylene polyphenyl polyisocyanate and polyols such as trimethylolpropane, polyether polyol, or polyester polyol. These compounds are highly reactive resins and can polymerize with moisture in an atmosphere. In order to prevent such problem, resins in the present invention are preferably used as urethane resins called blocked isocyanates in which the foregoing resins are stabilized with phenols or oximes.

The amount of the melamine resin or the urethane resin to be added to the resin composition in the present invention is 0.1 wt % to 20 wt % of the total resin composition. When the amount is less than 0.1 wt %, the effect of cross linking polyvinyl acetal resins cannot be obtained sufficiently, thereby deteriorating heat resistance of an insulating layer. When the amount is greater than 20 wt %, resin components are not fixed sufficiently in the dielectric layer.

In addition to the essential components mentioned above, the resin composition may contain additives if necessary such as inorganic filler represented by talc or aluminum hydroxide, an antifoaming agent, a leveling agent, or a coupling agent. Use of these additives improves penetratability of resin components to the dielectric layer, increase resistivity on flame retardant, reduce cost, and so on.

The resin composition mentioned above is used as a dilute resin varnish having a solid content controlled with a solvent in a certain range for the purpose of promoting impregnation of the composition into the dielectric layer. The details thereof will be described later.

Additive components in dielectric layer: It is also preferable to add one or two selected from manganese, silicon, nickel, aluminum, lanthanum, niobium, magnesium, and tin to the dielectric oxide film and segregate the metals in grain boundaries, thereby interrupting passages of leakage currents. In particular, manganese is preferably used. The manganese is considered to be present in the dielectric film as manganese oxides. The manganese is most preferably segregated in grain boundaries of dielectric oxide films obtained by the sol-gel method or the like, thereby increasing efficiency of interrupting passages of leakage currents. In this case, preferred amounts of manganese added to the dielectric oxide films are 0.01 mol % to 5.00 mol %. When the amounts of manganese is less than 0.01 mol %, manganese is not sufficiently segregated in grain boundaries of dielectric oxide films obtained by the sol-gel method, thereby not providing sufficient effect of reducing leakage currents. On the other hand, when the amounts of manganese is greater than 5.00 mol %, manganese is excessively segregated in grain boundaries of dielectric oxide films obtained by the sol-gel method, thereby providing brittle dielectric films with deteriorated toughness. As a result, problems tend to be caused such that sprayed etchant breaks dielectric layers when the shapes of top electrodes are processed by an etching method. In addition, use of excessive amounts of manganese tends to suppress growth of oxide crystal structures in manufacturing methods described later. Therefore, by employing composition containing manganese in the range to reduce leakage currents of capacitors, long life can be achieved. It should be noted that more preferred amounts of manganese added to the dielectric oxide films are 0.25 mol % to 1.50 mol %. Use of the amounts in this range assures quality of the dielectric oxide films more preferably. It should be noted that the dielectric oxide films are dielectric films with a perovskite-type structure. The dielectric oxide films do not contain manganese oxide unless it is clearly described that the dielectric oxide films contain manganese oxide components.

It is also assumed that manganese can occupy its position in an oxide crystal lattice by substitution. In general, dielectric oxide films cause oxygen deficiency due to crystallization under a low partial pressure of oxygen. Then it is considered that the valence number of titanium is reduced from tetravalence to trivalence, and hopping of electrons between titanium atoms with different valence numbers deteriorates insulating properties. However, when proper amounts of manganese are substituted to be solid solution in oxide crystals, the manganese behaves in the valence state of divalence or trivalence to compensate the oxygen deficiency, thereby preventing the reduction of titanium. Therefore, the addition of manganese is expected to provide an effect of increasing insulating properties.

Thickness of dielectric layer: The dielectric layer formed by the method for forming a dielectric oxide layer according to the present invention preferably has a thickness of 20-nano meter to 1-micron meter. The thinner the dielectric layer, the larger capacitance is obtained. Therefore, thinner dielectric layers are more preferable. However, a dielectric layer with a thickness less than 20 nm does not provide the effect of reducing leakage currents even though manganese, silicon or the like is added to the dielectric layer as described above. Consequently, dielectric breakdown happens at an early stage, and thus a capacitor layer with long life cannot be obtained. On the other hand, when a small capacitance is acceptable, the dielectric layer can be thick. However, in consideration of values required in the market for a capacitance of a capacitor circuit, it is understood that the thickness of about 1-micron meter is the upper limit of the dielectric layer.

Second conductive layer (bottom electrode): Various materials may be selectively used for the second conductive layer in consideration of heat applied in forming the dielectric layer by any one of a sol-gel method, an MOCVD method, and a sputtering deposition method. More specifically, various conductive materials of copper, nickel, cobalt, gold, platinum or the like may be used.

However, when the dielectric layer is formed by the sol-gel method, the dielectric layer is subjected to high temperature. Therefore, among heat resistant metals, a nickel layer or a nickel alloy layer is preferably used as the second conductive layer.

The nickel layer or the nickel alloy layer used described herein is intended to mainly metal foils. Therefore, the nickel layer is formed with so-called pure nickel foils with purities of 99.9% or more (with incidental impurities). An example of the nickel alloy layer is formed with a nickel-phosphorus alloy. The nickel-phosphorus alloy used herein preferably has a phosphorus content of 0.1 wt % to 11 wt %. The phosphorus component in the nickel-phosphorus alloy layer diffuses into the dielectric layer when the alloy layer is subjected to high temperature in manufacturing the material for forming a capacitor layer or in conventional manufacturing processes of printed wiring boards. It is considered that the diffusion of the phosphorus component shown above deteriorates adhesion of the alloy layer to the dielectric layer and affects on the dielectric constant of the dielectric layer. However, a nickel-phosphorus alloy layer having proper phosphorus content improves electrical characteristics of a capacitor. When the phosphorus content is less than 0.1 wt %, the results are almost the same as the case of using pure nickel and use of the alloy is meaningless. On the other hand, when the phosphorus content is greater than 11 wt %, phosphorus is segregated at the interface of the dielectric layer to deteriorate adhesion of the alloy layer to the dielectric layer, and thus make the alloy layer easy to peel. Therefore, preferred phosphorus content is in the range of 0.1 wt % to 11 wt %. Furthermore, in order to assure adhesion of the alloy layer to the dielectric layer more stabile, the phosphorus content is in the range of 0.2 wt % to 3 wt %. Use of the phosphorus content in the range makes it possible to form capacitor circuits of steady quality even though processes for forming the capacitor circuits have some deviations. The optimum range of the phosphorus content is further mentioned. When the phosphorus content is in the range of 0.25 wt % to 1 wt %, the best adhesion of the alloy layer to the dielectric layer is obtained and a good dielectric constant is also obtained. It should be noted that the phosphorus contents mentioned in the present invention are values converted based on [weight of P component]/[weight of Ni component]×100 (wt %).

The nickel foil or the nickel alloy foil mentioned in the present invention includes all the foils obtained by a rolling process, an electrolytic process, or the like. Their concept is described as including a composite foil that has a nickel layer or a nickel alloy layer on the surface of a metal foil. For example, a composite material having a nickel layer or a nickel alloy layer on the surface of a copper foil may be used as a component for the second conductive layer.

The nickel foil or the nickel alloy foil having such physical properties hardly suffers from deterioration of strength even though the foil is subjected to high temperature processing at 300° C. to 400° C. in processing of the printed wiring boards in which a fluorine-including resin substrate, a liquid crystal polymer, or the like is used as a substrate material. As a result, the material for forming a capacitor layer in which the metal foils are used for the second conductive layer hardly suffers from deterioration of quality. It should be noted that crystal structures of the nickel foil or the nickel alloy foil according to the present invention preferably have crystal grains as fine as possible to have higher strength. More specifically, the crystal structures preferably have fine crystal grains with an average grain size of 0.5-micron meter or less and have physical properties of high mechanical strength.

The second conductive layer preferably has a thickness of 1-micron meter to 100-micron meter. When the thickness is less than 1-micron meter, the electrode is considerably unreliable on a capacitor circuit formed, and it is extremely difficult to form a dielectric layer thereon. On the other hand, there is almost no practical demand for a thickness greater than 100-micron meter. Handling of the second conductive layer with a thickness equal to or less than 10-micron meter is difficult. Therefore, it is preferable to use a metal foil with a carrier foil in which the metal foil constituting the second conductive layer is put onto a carrier foil via a bonding interface. The carrier foil may be removed after the material for forming a capacitor layer according to the present invention is formed.

The nickel foil or the nickel alloy foil used for forming the second conductive layer mentioned above may be foils obtained by an electrolytic process or a rolling process. These manufacturing processes are not particularly restricted. In particular, the rolling process is conducted as follows: components of an ingot are prepared by metallurgical processes, and the ingot is processed into foils with rolling mills with conducting proper annealing treatments. The rolling process is properly conducted by employing conventional techniques.

In contrast, the electrolytic process provides different metal structures deposited depending on an electrolytic solution, electrolytic conditions, or the like, and which affects on physical strength of the foils. However, for a nickel layer formation, various solutions known as nickel plating solutions may be used. Examples of the conditions are as follows: (i) conditions where nickel sulfate is used, nickel concentration is 5 to 30 g/l, solution temperature is 20 to 50° C., pH is 2 to 4, and current density is 0.3 to 10 A/dm$^2$; (ii) conditions where nickel sulfate is used, nickel concentration is 5 to 30 g/l, potassium pyrophosphate is of 50 to 500 g/l, solution temperature is 20 to 50° C., pH is 8 to 11, and current density is 0.3 to 10 A/dm$^2$; (iii) conditions where nickel sulfate is used, nickel concentration is 10 to 70 g/l, boric acid is of 20 to 60 g/l, solution temperature is 20 to 50° C., pH is 2 to 4, and current density is 1 to 50 A/dm$^2$; conditions used in typical Watts bath; or the like.

When the nickel-phosphorus alloy foil is manufactured by the electrolytic process, a phosphoric acid base solution is used as an electrolytic solution. In this case, the following conditions can be employed: (i) conditions where nickel sulfate has a concentration of 120 g/l to 180 g/l, nickel chloride has a concentration of 35 g/l to 55 g/l, $H_3PO_4$ has a concentration of 3 g/l to 5 g/l, $H_3PO_3$ has a concentration of 2 g/l to 4 g/l, solution temperature is 70° C. to 95° C., pH is 0.5 to 1.5, and current density is 5 to 50 A/dm$^2$; (ii) conditions where nickel sulfate has a concentration of 180 g/l to 280 g/l, nickel chloride has a concentration of 30 g/l to 50 g/l, $H_3BO_3$ has a concentration of 16 g/l to 25 g/l, $H_3PO_3$ has a concentration of 1 g/l to 5 g/l, solution temperature is 45 to 65° C., and current density is 5 to 50 A/dm$^2$; or the like. Alternatively, it is also possible to form the nickel-phosphorus alloy layer with an electroless process by using a commercially available electroless plating solution. However, this does not satisfy industrial productivity from the view point of a rate to form the layer.

First conductive layer: The first conductive layer is formed on the dielectric layer by a method of laminating a metal foil, a method of forming the conductive layer by a plating process, a sputtering deposition method, or the like. The first conductive layer typically has a thickness in the range of 0.1-micron meter to 50-micron meter.

Embodiment of Manufacturing Material for Forming Capacitor Layer According to the Present Invention The method for manufacturing the material for forming a capacitor layer according to the present invention is characterized in that the dielectric oxide film is formed on a surface of a material to be the bottom electrode by any one of a sol-gel method, an MOCVD method, and a sputtering deposition method; a resin varnish is coated on a surface of the dielectric oxide film to be impregnated into the dielectric oxide film; the resin is dried and cured to form the dielectric layer; and then a top electrode constituting layer is provided on the dielectric layer. Anyone of the sol-gel method, the MOCVD method, and the sputtering deposition method are not particularly restricted. It is sufficient that the desired dielectric oxide film, which is a $(Ba_{1-x}Sr_x)TiO3$ ($0<=x<=1$) film or a $BiZrO_3$ film is obtained as a result of using the method.

Figure 2:
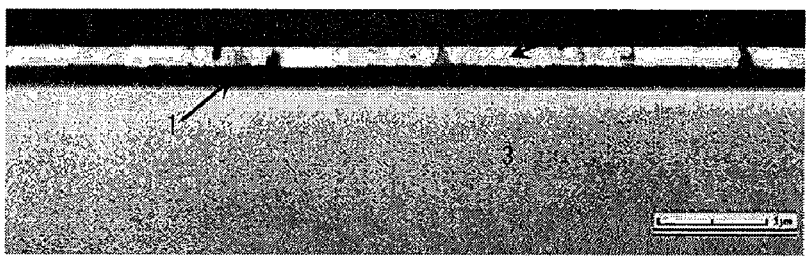
FIG. 2 is a FIB-SIM image of a cross section of a dielectric layer which is impregnated with a resin varnish having a low solid content of 0.05 wt %, which is out of the proper solid content range.
Figure 3:
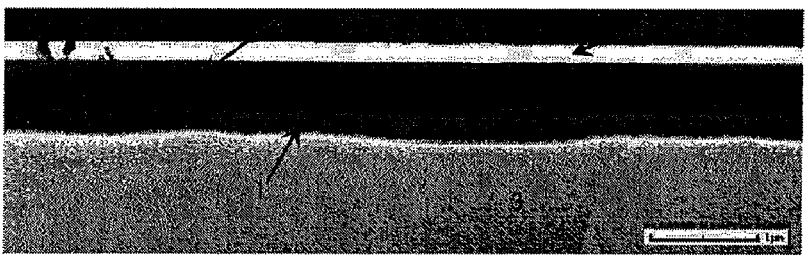
FIG. 3 is a FIB-SIM image of a cross section of a dielectric layer which is impregnated with a resin varnish having a high solid content of 2.2 wt %, which is out of the proper solid content range.

The resin varnish coated on the surface of the dielectric oxide film is prepared by dissolving the resin components in an organic solvent, providing a resin varnish having a solid content of 0.1 wt % to 1.0 wt %. When the solid content is less than 0.1 wt %, the viscosity of the resin varnish is so low that organic components do not remain in the dielectric layer. As a result, impregnation with a resin is meaningless. On the other hand, if the solid content is greater than 1.0 wt %, the viscosity of the resin varnish is too high that a resin film is formed on the dielectric layer when there is deviation in coating processes and excessive amounts of the resin are coated with a spin coater. This results in decrease of capacitance density, so it is not preferable. FIG. 1 shows a cross sectional view observed by FIB-SIM on the material for forming a capacitor layer which is impregnated with a resin varnish having a proper solid content of 0.3 wt %. As is evident from FIG. 1, a dielectric layer 1 exists between a top electrode 2 and a bottom electrode 3. Impregnated resin components can be observed as black dots in the dielectric layer 2. On the other hand, FIG. 2 shows a cross sectional view observed by FIB-SIM on the material for forming a capacitor layer which is impregnated with a resin varnish having a low solid content of 0.05 wt %. As is evident from FIG. 2, the portions to be black dots cannot be observed because resin components expected to be impregnated do not remain in the dielectric layer 2. FIG. 3 shows a cross sectional view observed by FIB-SIM on the material for forming a capacitor layer which is impregnated with a resin varnish having a high solid content of 2.2 wt %. As is evident from FIG. 3, resin components expected to be impregnated into the dielectric layer 2 are not impregnated sufficiently. Even the black dots portions can be observed in the dielectric layer 2, the resin components that could not penetrate into the dielectric layer 2 can be found as a resin film 4 on the dielectric layer 2.

Therefore, the resin varnish should have a solid content in the range of 0.1 wt % to 1.0 wt % to assure good penetration into the dielectric layer. As for the organic solvent, either ethyl methyl ketone or cyclopentanone or a mixture thereof is used to dissolve the resin components. This is because ethyl methyl ketone and cyclopentanone can be volatilized efficiently by heating at about 190° C. Treatments for purging the evaporated gas are also easy. Furthermore, use of ethyl methyl ketone and cyclopentanone makes it easy to adjust the viscosity of the resin solution to be optimum for impregnating the resin solution to the dielectric layer. In view of environmental protection, dissolving of the resin components in the mixture solvent of ethyl methyl ketone and cyclopentanone is preferable. As for the mixture, the mixing ratio is not particularly restricted. When cyclopentanone is used, ethyl methyl ketone is preferably mixed with that in consideration of the rate of volatilization. It should be noted that solvents other than those examples mentioned above may be used as long as the solvents can dissolve every resin component used in the present invention.

For coating the resin varnish on the surface of the dielectric layer, various methods may be used. In particular, the resin varnish is preferably coated by the spin-coating method in view of achieving uniform coating because the solid content of the resin varnish is extremely lower than those of popular resin varnishes.

In particular, when the dielectric oxide film is formed by the sol-gel method, the following processes (A) to (C) are preferably conducted because an oxide crystal structure with a grain size (a longitudinal diameter) of 50 nm to 300 nm is obtained. The crystal structure of the dielectric oxide film preferably has a grain size as large as possible. This is because the grain size as large as possible can result in reduction of an existing ratio of grain boundaries that may be passages of leakage currents. According to investigations conducted by the present inventors, it has been found that, regarding to the grain size, when the coarse crystal structure of the dielectric layer grows in the direction of the thickness and in the direction of the plane, and includes an oxide crystal structure with a grain size (a longitudinal diameter) of 50-nano meter to 300-nano meter, leakage currents are reduced, the dielectric layer has a large capacitance, the useful life of the dielectric layer can be lengthened and have long-term durability. The grain size used herein is obtained by processing a section of the dielectric layer with a focused ion beam, and measuring a longitudinal diameter of a coarse grain directly observed in the image when the section is observed with a transmission electron microscope at a magnification of 1000000 times. Although thus obtained value is not a grain size in a strict sense, the value functions well as an indicator for showing the presence of coarse crystal grains. When the grain sizes (longitudinal diameters) observed are all less than 50 nm (in particular, an amorphous state), leakage currents are less in the amorphous state under low voltage, but a little increase of voltage results rapid increase of leakage currents when compared with dielectric oxide films obtained by the conventional sol-gel method. As a whole, it can be judged that reduction of leakage currents and increase of a capacitance is not achieved remarkably. On the other hand, in order to obtain crystal grains with a grain size (a longitudinal diameter) greater than 300 nm in an oxide crystal structure constituting the dielectric layer, extremely special manufacturing conditions have to be employed and industrial-scale production is substantially impossible.

Process (A): a solution preparation process of preparing a sol-gel solution for manufacturing an aiming dielectric oxide film. This process is not particularly restricted. Commercially available prepared solutions may be used, or the solution may be prepared by manufacturers. As a result, it is critical to obtain a $(Ba_{1-x}Sr_x)TiO3$ ($0<=x<=1$) film or a $BiZrO_3$ film, which is aiming, no matter how the film is prepared.

Process (B): a coating process of adjusting a film thickness by repeating a unit step twice or more times where the unit step comprises a sequential stages: coating the sol-gel solution on a surface of a metal foil to be the second conductive layer followed by drying the solution in an oxygen-containing atmosphere at 120° C. to 250° C. for 30 seconds to 10 minutes followed by subjecting the dried solution to pyrolysis in an oxygen-containing atmosphere at 270° C. to 390° C. for 5 minutes to 30 minutes. Process (B) is different from the conventional manufacturing method by the sol-gel method and is a feature of the present manufacturing method. In Process (B), the method for coating of the sol-gel solution on the surface of a metal foil to be the second conductive layer is not particularly restricted, but a spin coater is preferably used in consideration on even thickness of the formed film, properties of the sol-gel solution, or the like.

After the sol-gel solution is coated, the solution is dried in an oxygen-containing atmosphere at 120° C. to 250° C. for 30 seconds to 10 minutes. Then the dried solution is subjected to pyrolysis in an oxygen-containing atmosphere at 270° C. to 390° C. for 5 minutes to 30 minutes. The drying is conducted under the conditions of in 120° C. to 250° C. for 30 seconds to 10 minutes. When the drying is conducted with outside of the conditions, the pyrolyzed dielectric layer has bumping on its surface with poor drying, or the subsequent pyrolysis reaction proceeds unevenly with excessive drying, thereby it cause positional deviation of quality in the dielectric layer to be obtained. The drying and the pyrolyzing are conducted in an oxygen-containing atmosphere. This is because decomposition of organic compounds is not promoted in a reducing atmosphere.

After the drying is complete, pyrolysis is conducted in an oxygen-containing atmosphere at 270° C. to 390° C. for 5 minutes to 30 minutes. The temperature condition for the pyrolysis is extremely distinctive. Conventionally, pyrolysis is conducted in a temperature range of 450° C. to 550° C. On the other hand, the manufacturing method according to the present invention employs pyrolysis in the lower temperature range of 270° C. to 390° C. for the purpose of preventing excessive oxidation of the second conductive layer. When the pyrolysis temperature is less than 270° C., preferable pyrolysis does not occur no matter how long the pyrolysis is carried out. Conducting such pyrolysis is not productive and good capacitor characteristics cannot be obtained. On the other hand, when the dielectric layer formed on the surface of the metal base is heated at higher than 390° C., considerable oxidation is observed in the surface of the metal base at the interface between the dielectric layer and the metal base. However, in consideration of process deviation in mass production and safety of quality, the pyrolysis is preferably conducted in the temperature range with the upper limit of about 370° C., which is lower than 390° C. Heating period is determined depending on decomposition temperature and properties of a sol-gel solution to be employed. When above mentioned heating temperature range is employed, heating less than 5 minutes does not provide sufficient pyrolysis. With the heating for more than 30 minutes, oxidation proceeds in the surface of the metal base even in the temperature range.

The Process (B) is repeated twice or more times to adjust the film to have an aiming thickness. The Process (B) may be repeated with the same drying and pyrolyzing conditions as mentioned above.

Process (C): a baking process of ultimately conducting a baking treatment at 550° C. to 800° C. for 5 minutes to 60 minutes in an inert-gas substituted atmosphere or in a vacuum atmosphere to form the dielectric layer. After the baking process is conducted, an ultimate dielectric layer is obtained. The baking process is conducted by heating in an inert-gas substituted atmosphere or in a vacuum atmosphere for the purpose of preventing the second conductive layer made of a metal from deteriorating due to oxidation. Heating conditions employed in the process is in 550° C. to 800° C. for 5 minutes to 60 minutes. If the process is conducted in temperatures lower than the conditions, sintering is not achieved sufficiently and a good dielectric layer cannot be obtained that has excellent adhesion to the second conductive layer and a properly-grown oxide crystal structure. On the other hand, when the process is conducted in temperatures higher than the conditions, the dielectric layer deteriorates and the second conductive layer deteriorates in its physical strength. As a result, a material for forming a capacitor layer excellent in its mechanical strength cannot be obtained, and also capacitor characteristics such as large capacitance and long life time cannot be achieved.

In particular, when the dielectric oxide film is formed by the sol-gel method, the following processes (a) to (c) are preferably conducted for the purpose of increasing grain size as large as possible and making the grain as dense as possible.

Process (a): a solution preparation process of preparing a sol-gel solution for manufacturing an aiming dielectric oxide film. This process is not particularly restricted. Commercially available prepared solutions may be used, or the solution may be prepared by manufacturers. As a result, it is critical to obtain a $(Ba_{1-x}Sr_x)TiO3$ ($0<=x<=1$) film or a $BiZrO_3$ film, which is the aiming dielectric oxide film, no matter how the film is prepared.

Process (b): a coating process of adjusting a film thickness by repeating a unit step twice or more times and conducting at least one or more pre-baking treatments between the unit steps wherein the unit step comprises a sequential stages: coating the sol-gel solution on a surface of a metal foil to be the second conductive layer (for convenience of description, hereinafter simply referred to as "coating") followed by drying the solution in an oxygen-containing atmosphere at 120° C. to 250° C. for 30 seconds to 10 minutes (for convenience of description, hereinafter simply referred to as "drying") followed by subjecting the dried solution to pyrolysis in an oxygen-containing atmosphere at 270° C. to 390° C. for 5 minutes to 30 minutes (for convenience of description, hereinafter simply referred to as "pyrolysis"); and the pre-baking treatment is conducted at 550° C. to 800° C. for 2 minutes to 60 minutes in an inert-gas substituted atmosphere or in a vacuum atmosphere.

That is, in Process (b), the processes in the sequence stage of coating, drying and pyrolyzing in this order is referred to as the unit step. Conventional methods are conducted by simply repeating the unit step twice or more times and then ultimately conducting baking. On the other hand, in the present invention, at least one or more pre-baking treatments are conducted between the unit steps repeated twice or more times. For example, when the unit steps are repeated six times and the pre-baking treatment is conducted once, the followings may be conducted in this order: the unit step (1st), pre-baking treatment, the unit step (2nd), the unit step (3rd), the unit step (4th), the unit step (5th), and the unit step (6th). When the pre-baking treatments are conducted twice, the followings may be conducted in this order: the unit step (1st), pre-baking treatment, the unit step (2nd), the unit step (3rd), pre-baking treatment, the unit step (4th), the unit step (5th), and the unit step (6th). Furthermore, when the pre-baking treatment is conducted every between the unit steps, the followings are conducted in this order: the unit step (1st), pre-baking treatment, the unit step (2nd), pre-baking treatment, the unit step (3rd), pre-baking treatment, the unit step (4th), pre-baking treatment, the unit step (5th), pre-baking treatment, and the unit step (6th).

When the crystalline state of dielectric oxide films obtained by the conventional sol-gel method is observed, the presence of fine crystal grains and many voids in the crystal grains are found. This is considered to occur at the time of baking caused by volatilization of organic components contained in a sol-gel solution. On the other hand, employing the Process (b) provides dielectric oxide films each having a dense structure with high film density and few structural defects such as voids in crystal grains. Therefore, impregnating such dielectric oxide films with resin components provides materials for forming a capacitor layer that causes less leakage currents and has a dielectric layer with large capacitance.

The coating in the unit step is described herein. The method to coat the sol-gel solution on the surface of the metal base is not particularly restricted, but a spin coater is preferably used in consideration on uniform thickness of the film formed, properties of the sol-gel solution, or the like.

The metal base used herein is preferably a nickel layer or a nickel alloy layer by the same reason as mentioned above.

Next, the drying in the unit step is described. After finishing the coating of the sol-gel solution, the solution is dried in an oxygen-containing atmosphere at 120° C. to 250° C. for 30 seconds to 10 minutes; and the dried solution is subjected to pyrolysis in an oxygen-containing atmosphere at 270° C. to 390° C. for 5 minutes to 30 minutes. The drying is conducted in the conditions at 120° C. to 250° C. for 30 seconds to 10 minutes. When the drying is conducted with outside of the conditions, pyrolyzed dielectric layer may have bumping on its surface with poor drying, or pyrolysis reaction proceeds unevenly with excessive drying to cause positional deviation of quality in the dielectric layer to be obtained. The drying and the pyrolyzing are conducted in an oxygen-containing atmosphere. This is because decomposition of organic compounds is not promoted in a reducing atmosphere.

Furthermore, pyrolysis in the unit step is described. After the drying is complete, pyrolysis is conducted in the oxygen-containing atmosphere at 270° C. to 390° C. for 5 minutes to 30 minutes. The temperature condition for the pyrolysis is extremely distinctive. Conventionally, pyrolysis is conducted in the temperature range of 450° C. to 550° C. On the other hand, the manufacturing method according to the present invention employs pyrolysis in the lower temperature range of 270° C. to 390° C. for the purpose of preventing excessive oxidation of the metal base. When the pyrolysis temperature is less than 270° C., preferable pyrolysis does not occur no matter how long the pyrolysis is carried out. Conducting such pyrolysis is not productive and good capacitor characteristics cannot be obtained. On the other hand, when the dielectric layer formed on the surface of the metal base is heated at higher than 390° C., considerable oxidation is observed in the surface of the metal base at the dielectric layer/the metal base interface. However, in consideration of process deviation in mass production and safety of quality, the pyrolysis is preferably conducted in the temperature range with the upper limit of about 370° C., which is lower than 390° C. Heating period is determined depending on decomposition temperature and properties of a sol-gel solution to be employed. When above mentioned heating temperature range is employed, heating less than 5 minutes does not provide sufficient pyrolysis. With the heating for more than 30 minutes, oxidation proceeds in the surface of the metal base even in the temperature range.

Then the pre-baking treatment conducted between the unit steps is conducted at 550° C. to 800° C. for 2 minutes to 60 minutes in an inert-gas substituted atmosphere or in a vacuum atmosphere. These conditions are the same as those of the following Process (c), the critical meaning of the values are described in the following description.

Process (c): a baking process of ultimately conducting a baking treatment at 550° C. to 800° C. for 5 minutes to 60 minutes in an inert-gas substituted atmosphere or in a vacuum atmosphere to form the dielectric layer. This baking process is the so-called essential baking process. After this baking process is conducted, an ultimate dielectric layer is obtained. The baking process is conducted by heating in an inert-gas substituted atmosphere or in a vacuum atmosphere for the purpose of preventing the metal base made from deteriorating due to oxidation. Heating conditions employed in the process is at 550° C. to 800° C. for 5 minutes to 60 minutes. If the process is conducted in temperatures less than the conditions, baking are not achieved sufficiently and a good dielectric layer that has excellent adhesion to the base, a crystal structure with appropriate density and proper grain size cannot be obtained. On the other hand, when the process is conducted in temperatures higher than the conditions, the dielectric layer deteriorates and the base deteriorates in its physical strength. As a result, capacitor characteristics such as large capacitance and long life time cannot be achieved.

(Printed Wiring Board Formed with Material for Forming Capacitor Layer According to the Present Invention)

The material for forming a capacitor layer according to the present invention can be preferably used for forming an embedded capacitor layer of a multilayer printed wiring board. Capacitor circuit constructions are formed by an etching method on a first conductive layer and a second conductive layer located on each surface of the material for forming a capacitor layer. Thus, the material for forming a capacitor layer is used for constituting a multilayer printed wiring board. Use of the nickel or the nickel alloy for the second conductive layer makes it possible to form a bottom electrode with excellent adhesion to the dielectric layer. Such a bottom electrode formed with a material excellent in heat resistant such as nickel is not suffered from oxidation degradation and is less tend to cause changes in physical properties even after repeated hot-press processes in the range of 300° C. to 400° C. The method for manufacturing a printed wiring board comprising an embedded capacitor circuit by using the material for forming a capacitor layer according to the present invention is not particularly restricted, and any methods can be employed.

EXAMPLE 1

<Manufacturing of Material for Forming Capacitor Layer According to the Present Invention>

(Manufacturing of Foil for Second Conductive Layer)

A 50-micron meter thick nickel foil manufactured by a rolling process was used herein. It should be noted that the thickness of the nickel foil manufactured by a rolling process is indicated as a thickness of a gauge.

(Manufacturing of Material for Forming Capacitor Layer)

The nickel foil mentioned above was used for forming a second conductive layer to be used for forming a bottom electrode of a material for forming a capacitor layer. A dielectric layer was formed on the surface of the nickel foil by applying a sol-gel method. The nickel foil was subjected to a pretreatment before forming of the dielectric layer by the sol-gel method. The pretreatment was conducted by heating the nickel foil at 250° C. for 15 minutes and exposing the nickel foil to ultraviolet radiation for one minute.

(a) In this solution preparation process, a sol-gel solution to be used in the sol-gel method was prepared. This preparation was conducted by using BST-06-P (70/30) manufactured by Kojundo Chemical Laboratory Co., Ltd so as to obtain a $(Ba_{0.7}Sr_{0.3})TiO_3$ dielectric oxide film with the aiming composition.

(b) The sol-gel solution was coated on the surface of the nickel foil with a spin coater. The coated solution was dried at 150° C. for 2 minutes in an oxygen-containing atmosphere (an air atmosphere). The dried solution was subjected to pyrolysis at 330° C. for 15 minutes in air atmosphere. This coating process was repeated six times to adjust film thickness.

(c) Ultimately, a baking treatment was conducted at 650° C. for 15 minutes in an inert-gas substituted atmosphere (a nitrogen-substituted atmosphere) or in a vacuum atmosphere. Thus dielectric layers with various compositions were formed.

(d) Furthermore, after coating a resin varnish on the surface of the dielectric layer by the spin-coating method, keeping at room temperature for 30 minutes followed by heating in an oven at 150° C. for 5 minutes to remove a certain amount of a solvent and to dry to be semicured state. After that, the resin varnish was cured by heating in an oven at 190° C. for 30 minutes. The resin varnishes used here were two types prepared as described below.

40 parts by weight of a non-rubber-modified epoxy resin (trade name: EPOMIC R-301, manufactured by Mitsui Petrochemical Industries, Ltd.), 20 parts by weight of a rubber-modified epoxy resin (trade name: EPOTOHTO YR-102, manufactured by Tohto Kasei Co., Ltd.), 30 parts by weight of a polyvinyl acetal resin (trade name: DENKA BUTYRAL #5000A, manufactured by DENKI KAGAKU KOGYO KABUSHIKI KAISHA), 10 parts by weight as a solid content of a melamine resin (trade name: U-VAN 20SB manufactured by MITSUI TOATSU CHEMICALS, INC.), 2 parts by weight of a latent hardener for epoxy resins (dicyandiamide, reagent) (added as a 25 wt % solid content solution in dimethylformamide), and 0.5 parts by weight of a curing accelerator (trade name: Curezol 2E4MZ, manufactured by SHIKOKU CHEMICALS CORPORATION) were dissolved in ethyl methyl ketone to provide two types of resin varnishes in which one has a solid content of 0.22 wt % and the other has a solid content of 0.44 wt %.

<Forming of Capacitor Circuit>

Formation of capacitor circuit by etching method: On the dielectric layer thus resin is impregnated, 2-micron meter thick copper layer was formed as a first conductive layer by a sputtering deposition method. Thus a material for forming a capacitor layer comprising the first conductive layer and the second conductive layer on each side of the dielectric layer was formed. The material formed with the resin varnish having a solid content of 0.22 wt % is named as a sample 1-1. The material formed with the resin varnish having a solid content of 0.44 wt % is named as a sample 1-2.

An etching resist layer was formed on the surface of the first conductive layer of each of the materials for forming a capacitor layer (the sample 1-1 and the sample 1-2). Etching patterns for forming top electrode shapes were exposed and developed. After that, the first conductive layer was etched with a copper chloride base copper etchant followed by stripping of the etching resist, thereby capacitor circuit with 100 top electrodes each having an area of 1 mm by 1 mm was formed.

Forming of capacitor circuit by masking method: On the thus formed dielectric layer on each of the samples, a metal mask for deposition which has openings corresponding to top electrode shapes was placed on where a top electrode was subsequently formed. A 2-micron meter thick copper layer was formed as a top electrode by a sputtering deposition method to form a capacitor circuit. At this time, the capacitor circuit with 100 top electrodes having an area of 1 mm by 1 mm was formed. The material formed with the resin varnish having a solid content of 0.22 wt % is named as a sample 1-3. The material formed with the resin varnish having a solid content of 0.44 wt % is named as a sample 1-4.

<Evaluation of Dielectric Characteristics and Others>

Among the following characteristics, electrical characteristics except leakage currents were measured with a 4261A LCR meter (1 kHz, IV) manufactured by Hewlett-Packard Company. The leakage current was measured with a digital electrometer manufactured by ADVANTEST CORPORATION.

Yield of the electrodes: After the capacitor circuits were formed, a certain voltage was applied to 100 capacitor circuits in each samples and an interlayer dielectric strength was measured to obtain a ratio that short circuits were not caused across the top electrode and the bottom electrode. As a result, ratio was 73% in the sample 1-1, 54% in the sample 1-2, 90% in the sample 1-3, and 51% in the sample 1-4.

Capacitance density: The sample 1-1 had an capacitance density in the range of 1078 $nF/cm^2$ to 1359 $nF/cm^2$, the sample 1-2 had an capacitance density in the range of 1090 $nF/cm^2$ to 1370 $nF/cm^2$, the sample 1-3 had an capacitance density in the range of 1087 $nF/cm^2$ to 1387 $nF/cm^2$, and the sample 1-4 had an capacitance density in the range of 1126 $nF/cm^2$ to 1308 $nF/cm^2$. Each of the samples shows large capacitance.

Dielectric loss: the sample 1-1 had a dielectric loss in the range of 2.4% to 5.6%, the sample 1-2 had a dielectric loss in the range of 1.0% to 3.5%, the sample 1-3 had a dielectric loss in the range of 2.1% to 4.2%, and the sample 1-4 had a dielectric loss in the range of 1.3% to 4.0%.

Dielectric layer remaining after etching: Dielectric layer remaining in gaps between capacitor circuits after circuit formation was inspected. This inspection for the dielectric layer remaining was conducted by observing gaps between the circuits with a metallurgical microscope. If the dielectric layer remained, an interference color of rainbow may be observed. As a result, dielectric layer remaining was confirmed in the sample 1-1 and the sample 1-2 both of which were manufactured by the etching method.

Leakage current: Leakage currents were measured by applying a voltage of −5 V to 5V across the top electrode and the bottom electrode of the capacitor circuits in each samples of 1-1 to 1-4. The results are described in Table 1 together with the above characteristics so as to compare the results with those of Comparative Example 1 described later. It should be noted that the capacitance density in Table 1 is described as an average capacitance density, and the dielectric loss in Table 1 is described as an average dielectric loss.

EXAMPLE 2

<Manufacturing of Material for Forming Capacitor Layer According to the Present Invention>

(Manufacturing of Foil for Second Conductive Layer)

A 50-micron meter thick nickel foil manufactured by a rolling process was used herein. It should be noted that the thickness of the nickel foil manufactured by a rolling process is indicated as a thickness of a gauge. The nickel foil would constitute the second conductive layer in a material for forming capacitor layer to be formed.

(Manufacturing of Material for Forming Capacitor Layer)

A dielectric layer was formed on the surface of the nickel foil by applying a sol-gel method. The nickel foil was subjected to a pretreatment before formation of the dielectric layer by the sol-gel method. The pretreatment was conducted by heating the nickel foil at 250° C. for 15 minutes and exposing the nickel foil to ultraviolet radiation for one minute.

Process (a): In this solution preparation process, a sol-gel solution to be used in the sol-gel method was prepared. This preparation was conducted by using 7 wt % BST (trade name: thin film forming material BST, manufactured by Mitsubishi Materials Corporation) so as to obtain a dielectric oxide film with a composition of $Ba_{0.7}Sr_{0.3}TiO_3$.

Process (b): In this process, a series of stages was defined as a unit step in which the sol-gel solution was coated on the surface of the nickel foil followed by drying at 150° C. for 2 minutes in an oxygen-containing atmosphere followed by subjecting to pyrolysis at 330° C. for 15 minutes in an oxygen-containing atmosphere. While the unit step was repeated six times to adjust film thickness, wherein at least one pre-baking treatment was conducted between the unit steps. The pre-baking treatment was conducted at 650° C. for 15 minutes in an inert-gas substituted atmosphere or in a vacuum atmosphere. Thus, two samples were obtained.

One of the samples was obtained by conducting one pre-baking treatment between the 1st unit step and the 2nd unit step (hereafter, the sample is referred to as a sample A).

The other of the samples was obtained by conducting pre-baking treatments twice, between the 1st unit step and the 2nd unit step, and between the 3rd unit step and the 4th unit step (hereafter, the sample is referred to as a sample B).

Process (c): Then each of the above samples was subjected to a baking treatment at 650° C. for 15 minutes in an inert-gas substituted atmosphere (a nitrogen-substituted atmosphere) or in a vacuum atmosphere. Thus, a dielectric layer was formed on the surface of the nickel foil as a base metal.

(d) Furthermore, a resin varnish having a solid content of 0.44 wt % was coated on the surface of each dielectric layer of the samples A and B by the spin-coating method. The resin was impregnated into the dielectric layers as with Example 1.

<Forming of Capacitor Circuit>

Forming of capacitor circuit by etching method: On each of the dielectric layer of the samples A and B after resin impregnation, a 2-micron meter thick copper layer was formed as a first conductive layer by a sputtering deposition method. Thus a material for forming a capacitor layer comprising the first conductive layer and the second conductive layer on each side of the dielectric layer was formed.

An etching resist layer was formed on the surface of the first conductive layer of each of the materials for forming a capacitor layer. Etching patterns for forming top electrode shapes were exposed and developed. After that, the first conductive layer was etched with a copper chloride base copper etchant followed by stripping of the etching resist, thereby capacitor circuit with 100 top electrodes each having an area of 1 mm by 1 mm was formed. The material formed with the sample A is named as a sample 2-1. The material formed with the sample B is named as a sample 2-2.

Forming of capacitor circuit by masking method: On the thus formed dielectric layer on each of the samples A and B, a metal mask for deposition which has openings corresponding to top electrode shapes was placed on where a top electrode was subsequently formed. A 2-micron meter thick copper layer was formed as a top electrode by a sputtering deposition method to form a capacitor circuit. At this time, capacitor circuit with 100 top electrodes each having an area of 1 mm by 1 mm was formed. The material formed with the sample A is named as a sample 2-3. The material formed with the sample B is named as a sample 2-4.

<Evaluation of Dielectric Characteristics and Others>

Yield of electrodes: After the capacitor circuit was formed, a certain voltage was applied to 100 capacitor circuits of each of the samples and an interlayer dielectric strength was measured to obtain a ratio that short circuits were not caused across the top electrode and the bottom electrode. As a result, each ratio was 100% in the sample 2-1, 100% in the sample 2-2, 100% in the sample 2-3, and 100% in the sample 2-4.

Capacitance density: The sample 2-1 had an capacitance density in the range of 1022 $nF/cm^2$ to 1243 $nF/cm^2$, the sample 2-2 had an capacitance density in the range of 1157 $nF/cm^2$ to 1234 $nF/cm^2$, the sample 2-3 had an capacitance density in the range of 1048 $nF/cm^2$ to 1209 $nF/cm^2$, and the sample 2-4 had an capacitance density in the range of 1124 $nF/cm^2$ to 1296 $nF/cm^2$. Each of the samples shows large capacitance.

Dielectric loss: the sample 2-1 had a dielectric loss in the range of 1.9% to 5.5%, the sample 2-2 had a dielectric loss in the range of 1.2% to 4.5%, the sample 2-3 had a dielectric loss in the range of 1.1% to 3.9%, and the sample 2-4 had a dielectric loss in the range of 1.5% to 3.0%.

Dielectric layer remaining after etching: evaluation as with Example 1 was conducted. As a result, dielectric layer remaining was confirmed in the sample 2-1 and the sample 2-2 both of which were manufactured by the etching method.

Leakage current: Leakage currents were measured by applying a voltage of −5 V to 5V across the top electrode and the bottom electrode of the capacitor circuits in each samples of 2-1 to 2-4. The results are described in Table 2 together with the above characteristics so as to compare the results with those of Comparative Example 2. It should be noted that the capacitance density in Table 2 is described as an average capacitance density, and the dielectric loss in Table 2 is described as an average dielectric loss.

COMPARATIVE EXAMPLE

Comparative Example 1

Comparative Example 1 was conducted as with Example 1 except that the resin impregnation in Example 1 was omitted. Therefore, description is eliminated to avoid overlaps. Only evaluation results are described hereafter. It should be noted that a sample 3-1 was obtained by omitting the resin impregnation of the samples 1-1 and 1-2; and a sample 3-2 was obtained by omitting the resin impregnation of the samples 1-3 and 1-4.

<Evaluation of Dielectric Characteristics and Others>

Yield of electrodes: After the capacitor circuit was formed, a certain voltage was applied to 100 capacitor circuits of each of the samples and an interlayer dielectric strength was measured to obtain a ratio that short circuits were not caused across the top electrode and the bottom electrode. As/a result, each ratio was 13% in the sample 3-1, and 36% in the sample 3-2.

Capacitance density: The sample 3-1 had a capacitance density in the range of 1040 nF/cm$^2$ to 1331 nF/cm$^2$, and the sample 3-2 had a capacitance density in the range of 1023 nF/cm$^2$ to 1181 nF/cm$^2$. Each of the samples shows large capacitance.

Dielectric loss: Both of the samples show large dielectric loss. The sample 3-1 had a dielectric loss in the range of 4.5% to 8.3%, and the sample 3-2 had a dielectric loss in the range of 3.8% to 7.6%.

Dielectric layer remaining after etching: Dielectric layer remaining in gaps between capacitor circuits after circuit formation was inspected. This inspection for the presence of the remaining dielectric layer was conducted by observing the gaps between the circuits with a metallurgical microscope. When the dielectric layer remains, an interference color of rainbow may be observed. As a result, dielectric layer remaining was not confirmed in the sample 3-1 manufactured by the etching method.

Leakage current: Leakage currents were measured by applying a voltage of −5 V to 5 V across the top electrode and the bottom electrode of the capacitor circuits in each sample of 3-1 and 3-2. The results are described in Table 1 together with the above characteristics so as to compare the results with those of Example 1 described before. It should be noted that the capacitance density in Table 1 is described as an average capacitance density, and the dielectric loss in Table 1 is described as an average dielectric loss.

omitting the resin impregnation of the sample 2-2, a sample 4-3 was obtained by omitting the resin impregnation of the sample 2-3, and a sample 4-4 was obtained by omitting the resin impregnation of the sample 2-4.

<Evaluation of Dielectric Characteristics and Others>

Yield of electrodes: After the capacitor circuit was formed, a certain voltage was applied to 100 capacitor circuits of each of the samples and an interlayer dielectric strength was measured to obtain a ratio that short circuits were not caused across the top electrode and the bottom electrode. As a result, each ratio was 70% in the sample 4-1, 100% in the sample 4-2, 100% in the sample 4-3, and 100% in the sample 4-4.

Capacitance density: The sample 4-1 had an capacitance density in the range of 1310 nF/cm$^2$ to 1504 nF/cm$^2$, the sample 4-2 had an capacitance density in the range of nF/cm$^2$ to 1279 nF/cm$^2$, the sample 4-3 had an capacitance density in the range of 1153 nF/cm$^2$ to 1302 nF/cm$^2$, and the sample 4-4 had an capacitance density in the range of 1097 nF/cm$^2$ to 1293 nF/cm$^2$. Each of the samples shows large capacitance.

Dielectric loss: Each of the samples shows large dielectric loss. The sample 4-1 had a dielectric loss in the range of 4.2% to 7.3%, the sample 4-2 had a dielectric loss in the range of 1.3% to 3.5%, the sample 4-3 had a dielectric loss in the range of 1.5% to 3.8%, and the sample 4-4 had a dielectric loss in the range of 1.1% to 3.2%.

Dielectric layer remaining after etching: Evaluation was conducted as with Example 1. As a result, dielectric layer remaining was confirmed in the samples 4-1 and 4-2 which were manufactured by the etching method.

Leakage current: Leakage currents were measured by applying a voltage of −5 V to 5V across the top electrode and the bottom electrode of the capacitor circuits in each sample of 4-1 to 4-4. The results are described in Table 2 together with the above characteristics so as to compare the results with those of Example 2 described before. It should be noted that the capacitance density in Table 2 is described as an average capacitance density, and the dielectric loss in Table 2 is described as an average dielectric loss.

TABLE 1

| Samples | Resin Impregnation | Capacitance Density nF/cm$^2$ | Dielectric Loss % | Yield of Electrode % | Leakage current (A/cm$^2$) | | | | | | | | | | |
|---|---|---|---|---|---|---|---|---|---|---|---|---|---|---|---|
| | | | | | −5 V | −4 V | −3 V | −2 V | −1 V | 0.1 V | 1 V | 2 V | 3 V | 4 V | 5 V |
| Example | | | | | | | | | | | | | | | |
| Sample 1-1 | Done | 1078–1359 (1195) | 4.6 | 73 | 9.1 × 10$^{-4}$ | 3.6 × 10$^{-5}$ | 3.9 × 10$^{-5}$ | 1.4 × 10$^{-6}$ | 3.9 × 10$^{-8}$ | 9.3 × 10$^{-9}$ | 1.2 × 10$^{-7}$ | 3.1 × 10$^{-7}$ | 2.3 × 10$^{-6}$ | 8.9 × 10$^{-6}$ | 3.3 × 10$^{-5}$ |
| Sample 1-2 | | 1090–1370 (1220) | 2.6 | 54 | 8.3 × 10$^{-4}$ | 4.4 × 10$^{-5}$ | 4.3 × 10$^{-6}$ | 1.8 × 10$^{-6}$ | 3.8 × 10$^{-8}$ | 7.3 × 10$^{-9}$ | 3.9 × 10$^{-7}$ | 3.7 × 10$^{-7}$ | 1.9 × 10$^{-6}$ | 7.9 × 10$^{-6}$ | 8.4 × 10$^{-5}$ |
| Sample 1-3 | | 1087–1387 (1172) | 3.1 | 90 | 6.7 × 10$^{-5}$ | 9.3 × 10$^{-6}$ | 4.4 × 10$^{-7}$ | 9.4 × 10$^{-8}$ | 3.9 × 10$^{-8}$ | 5.3 × 10$^{-9}$ | 1.0 × 10$^{-8}$ | 7.1 × 10$^{-8}$ | 2.9 × 10$^{-7}$ | 6.8 × 10$^{-7}$ | 7.9 × 10$^{-6}$ |
| Sample 1-4 | | 1126–1308 (1165) | 2.3 | 51 | 7.7 × 10$^{-5}$ | 1.7 × 10$^{-5}$ | 2.1 × 10$^{-6}$ | 1.0 × 10$^{-7}$ | 4.5 × 10$^{-8}$ | 4.0 × 10$^{-9}$ | 1.4 × 10$^{-8}$ | 6.9 × 10$^{-8}$ | 3.3 × 10$^{-7}$ | 8.9 × 10$^{-7}$ | 9.1 × 10$^{-6}$ |
| Comparative Example | | | | | | | | | | | | | | | |
| Sample 3-1 | None | 1040–1331 (1201) | 6.3 | 13 | 6.3 × 10$^{-2}$ | 5.6 × 10$^{-3}$ | 7.9 × 10$^{-4}$ | 6.3 × 10$^{-5}$ | 2.9 × 10$^{-7}$ | 9.3 × 10$^{-9}$ | 6.2 × 10$^{-7}$ | 1.0 × 10$^{-5}$ | 7.3 × 10$^{-4}$ | 6.7 × 10$^{-3}$ | 9.3 × 10$^{-3}$ |
| Sample 3-2 | | 1023–1181 (1128) | 5.1 | 36 | 4.3 × 10$^{-4}$ | 2.2 × 10$^{-4}$ | 5.9 × 10$^{-5}$ | 2.6 × 10$^{-6}$ | 1.9 × 10$^{-8}$ | 2.7 × 10$^{-9}$ | 2.6 × 10$^{-8}$ | 6.7 × 10$^{-7}$ | 3.2 × 10$^{-6}$ | 3.6 × 10$^{-5}$ | 1.7 × 10$^{-4}$ |

Comparative Example 2

Comparative Example 2 was conducted as with Example 2 except that the resin impregnation in Example 2 was omitted. Therefore, description is eliminated to avoid overlaps. Only evaluation results are described hereafter. It should be noted that a sample 4-1 was obtained by omitting the resin impregnation of the sample 2-1, a sample 4-2 was obtained by

TABLE 2

| Samples | Resin Impregnation | Capacitance Density nF/cm² | Dielectric Loss % | Yield of Electrode % | Leakage current (A/cm²) | | | | | | | | | | |
|---|---|---|---|---|---|---|---|---|---|---|---|---|---|---|---|
| | | | | | −5 V | −4 V | −3 V | −2 V | −1 V | 0.1 V | 1 V | 2 V | 3 V | 4 V | 5 V |
| Example | | | | | | | | | | | | | | | |
| Sample 2-1 | Done | 1022-1243 (1098) | 4.3 | 100 | 5.3 × 10⁻⁴ | 4.0 × 10⁻⁵ | 1.9 × 10⁻⁵ | 1.4 × 10⁻⁶ | 3.9 × 10⁻⁸ | 4.3 × 10⁻⁹ | 3.9 × 10⁻⁸ | 8.1 × 10⁻⁸ | 4.9 × 10⁻⁷ | 6.97× 10⁻⁶ | 7.3 × 10⁻⁵ |
| Sample 2-2 | | 1157-1234 (1193) | 2.4 | 100 | 2.3 × 10⁻⁵ | 9.4 × 10⁻⁶ | 1.9 × 10⁻⁶ | 1.4 × 10⁻⁷ | 2.1 × 10⁻⁸ | 4.3 × 10⁻⁹ | 9.9 × 10⁻⁹ | 3.1 × 10⁻⁸ | 3.1 × 10⁻⁷ | 9.9 × 10⁻⁷ | 1.3 × 10⁻⁵ |
| Sample 2-3 | | 1046-1209 (1130) | 2.6 | 100 | 8.3 × 10⁻⁶ | 8.2 × 10⁻⁷ | 3.9 × 10⁻⁷ | 7.4 × 10⁻⁸ | 1.9 × 10⁻⁸ | 3.3 × 10⁻⁹ | 8.9 × 10⁻⁹ | 3.1 × 10⁻⁸ | 1.9 × 10⁻⁷ | 6.0 × 10⁻⁷ | 4.3 × 10⁻⁶ |
| Sample 2-4 | | 1124-1296 (1203) | 2.3 | 100 | 4.3 × 10⁻⁷ | 2.0 × 10⁻⁷ | 8.9 × 10⁻⁸ | 1.4 × 10⁻⁸ | 6.9 × 10⁻⁹ | 2.3 × 10⁻⁹ | 3.9 × 10⁻⁹ | 8.1 × 10⁻⁹ | 3.9 × 10⁻⁸ | 9.0 × 10⁻⁸ | 1.3 × 10⁻⁷ |
| Comparative Example | | | | | | | | | | | | | | | |
| Sample 4-1 | None | 1310-1504 (1440) | 6 | 70 | 9.3 × 10⁻³ | 8.6 × 10⁻⁵ | 5.9 × 10⁻⁵ | 6.6 × 10⁻⁶ | 8.9 × 10⁻⁸ | 7.3 × 10⁻⁹ | 9.2 × 10⁻⁸ | 2.1 × 10⁻⁷ | 5.3 × 10⁻⁶ | 3.7 × 10⁻⁵ | 5.3 × 10⁻⁴ |
| Sample 4-2 | | 1141-1279 (1220) | 2.8 | 100 | 1.3 × 10⁻⁴ | 6.4 × 10⁻⁵ | 5.9 × 10⁻⁶ | 5.4 × 10⁻⁷ | 4.1 × 10⁻⁸ | 4.3 × 10⁻⁹ | 4.9 × 10⁻⁸ | 8.7 × 10⁻⁸ | 1.1 × 10⁻⁶ | 4.9 × 10⁻⁶ | 7.0 × 10⁻⁵ |
| Sample 4-3 | | 1153-1302 (1247) | 2.9 | 100 | 3.7 × 10⁻⁵ | 3.0 × 10⁻⁶ | 9.7 × 10⁻⁷ | 3.4 × 10⁻⁷ | 4.9 × 10⁻⁸ | 3.3 × 10⁻⁹ | 8.9 × 10⁻⁹ | 3.1 × 10⁻⁸ | 1.9 × 10⁻⁷ | 6.0 × 10⁻⁷ | 7.3 × 10⁻⁶ |
| Sample 4-4 | | 1097-1293 (1190) | 2.3 | 100 | 6.1 × 10⁻⁷ | 4.9 × 10⁻⁷ | 9.9 × 10⁻⁸ | 4.4 × 10⁻⁸ | 8.9 × 10⁻⁹ | 2.3 × 10⁻⁹ | 8.9 × 10⁻⁹ | 1.4 × 10⁻⁸ | 7.7 × 10⁻⁸ | 2.3 × 10⁻⁷ | 4.3 × 10⁻⁴ |

Comparison Between Example 1 and Comparative Example 1

Cases where capacitor circuits were formed by etching method: Capacitor circuits of the samples 1-1 and 1-2 in Example 1 were formed by the etching method, and thus the samples are compared with the sample 3-1 in Comparative Example 1. As is evident from Table 1, in view of only the capacitance density, the sample 3-1 had a good average capacitance density value of 1201 nF/cm². On the other hand, the samples 1-1 and 1-2 had large values of nF/cm² and 1220 nF/cm². Turning to the dielectric loss, the sample 3-1 had a dielectric loss of 6.3% while the samples 1-1 and 1-2 had dielectric losses of 4.6% and 2.6%. That is, it is obvious that the samples 1-1 and 1-2 in Example 1 have achieved large capacitances and are more excellent in quality stability as capacitors.

Regarding to the yield of electrodes after capacitor circuit formation by the etching method, the sample 1-1 was 73% and the sample 1-2 was 54% while the sample 3-1 was 13%. Therefore, it has been understood that Examples are also excellent in manufacturing stability.

Furthermore, in terms of penetratability of the etchant to the dielectric layer, inspection was conducted for the dielectric layer remaining in gaps between capacitor circuits after the circuits were formed. As a result, dielectric layer remaining was confirmed in the samples 1-1 and 1-2. On the other hand, no dielectric layer remaining was confirmed in the sample 3-1. Therefore, it can be understood that the dielectric layers in Examples have excellent resistance against etchant.

Regarding to leakage currents, from comparison between the samples 1-1 and 1-2 and the sample 3-1 in Table 1, leakage currents in the samples 1-1 and 1-2 are smaller. Thus, the effect of impregnating the dielectric layer with the resin has been confirmed.

Cases where capacitor circuits were formed by masking method: Capacitor circuits of the samples 1-3 and 1-4 in Example 1 were formed by the masking method, and thus the samples are compared with the sample 3-2 in Comparative Example 1. As is evident from Table 2, in view of only the capacitance density, the sample 3-2 had also a good average capacitance density value of 1128 nF/cm². On the other hand, the samples 1-3 and 1-4 had big values of 1172 nF/cm² and 1165 nF/cm². Regarding to the dielectric loss, the sample 3-2 had a dielectric loss of 5.1% while the samples 1-3 and 1-4 had dielectric losses of 3.1% and 2.3%. That is, it is obvious that the samples 1-3 and 1-4 in Example have achieved large capacitance and are more excellent in quality stability as capacitors.

Regarding to the yield of electrodes after the capacitor circuit formation by the masking method, the sample 1-3 was 90% and the sample 1-4 was 51% while the sample 3-2 was 36%. Therefore, it has been understood that Examples are also excellent in manufacturing stability.

Regarding to leakage currents, from comparison between the samples 1-3 and 1-4 and the sample 3-2 in Table 1, leakage currents in the samples 1-3 and 1-4 were obviously smaller. Thus, the effect of impregnating the dielectric layer with the resin has been confirmed.

Comparison Between Example 2 and Comparative Example 2

Cases where capacitor circuits were formed by etching method: Capacitor circuits of the samples 2-1 and 2-2 in Example 2 were formed by the etching method, and thus the samples are compared with the samples 4-1 and 4-2 in Comparative Example 2. As is evident from Table 2, in view of only the capacitance density, the samples 4-1 and 4-2 had good average capacitance density values of 1440 nF/cm² and 1220 nF/cm². On the other hand, the samples 2-1 and 2-2 had values of 1098 nF/cm² and 1193 nF/cm². Therefore, though Examples are slightly inferior, Examples and Comparative Examples had the same level of capacitance density. Regarding to the dielectric loss, the samples 4-1 and 4-2 had dielectric losses of 6.0% and 2.8% while the samples 2-1 and 2-2 had dielectric losses of 4.3% and 2.4%. That is, the samples 2-1 and 2-2 in Example and the samples 4-1 and 4-2 in Comparative Example have almost same quality in the capacitance density and in the dielectric loss.

Regarding to the yield of electrodes after capacitor circuit formation by the etching method, the sample 2-1 was 100% and the sample 2-2 was 100% while the sample 4-1 was 70%, and the sample 4-2 was 100%. Therefore, it has been understood that Examples are also excellent in manufacturing stability.

Furthermore, in terms of penetratability of the etchant into the dielectric layer, inspection was conducted for dielectric layer remaining in gaps between capacitor circuits after the circuits were formed. As a result, dielectric layer remaining was confirmed in the samples 2-1 and 2-2. On the other hand, the dielectric layer was also remained in the samples 4-1 and 4-2. Therefore, it has been established that the samples 2-1 and 2-2 and the samples 4-1 and 4-2 were of equal quality in resistance against etchant.

Regarding to leakage currents, comparison between the samples 2-1 and 2-2 and the samples 4-1 and 4-2 in Table 2 shows that leakage currents were obviously smaller in the samples 2-1 and 2-2. Thus, the effect of impregnating the dielectric layer with the resin has been confirmed.

Cases where capacitor circuits were formed by masking method: Capacitor circuits of the samples 2-3 and 2-4 in Example 2 were formed by the masking method, and thus the samples are compared with the samples 4-3 and 4-4 in Comparative Example 2. As is evident from Table 2, in view of only the capacitance density, the samples 4-3 and 4-4 had good average capacitance density values of 1247 nF/cm$^2$ and 1190 nF/cm$^2$. On the other hand, the samples 2-3 and 2-4 had values of 1130 nF/cm$^2$ and 1203 nF/cm$^2$. Regarding to the dielectric loss, the samples 4-3 and 4-4 had dielectric losses of 2.9% and 2.3% while the samples 2-3 and 2-4 had dielectric losses of 2.6% and 2.3%, which were the same level as the samples 4-3 and 4-4. That is, there were no clear difference between the samples 1-3 and 1-4 in Example and the samples 4-3 and 4-4 in Comparative Example in terms of the capacitance density and the dielectric loss.

Regarding to the yield of electrodes after capacitor circuit formation by the masking method, the sample 2-3 was 100% and the sample 2-4 was 100% while the sample 4-3 was 100% and the sample 4-4 was 100%, which were the same level as the samples 2-3 and 2-4.

Regarding to leakage currents, comparison between the samples 2-3 and 2-4 and the samples 4-3 and 4-4 in Table 2 shows that leakage currents were obviously smaller in the samples 2-3 and 2-4. Thus, the effect of impregnating the dielectric layer with the resin has been confirmed.

INDUSTRIAL APPLICABILITY

The material for forming a capacitor layer according to the present invention achieves both reduction of occurrence of short circuit failures across a top electrode and a bottom electrode and reduction of a leakage current by impregnating a resin component into dielectric layer between a first conductive layer and a second conductive layer. When the material for forming a capacitor layer is used as a capacitor, the material exhibits large capacitance and low dielectric loss. Therefore, use of the material for forming a capacitor layer according to the present invention makes it possible to manufacture capacitor circuits with large capacitance and long life. Consequently, printed wiring boards and the like obtained by using the material for forming a capacitor layer may help power savings of electronic and electrical equipment.

By employing the manufacturing method of the material for forming a capacitor layer according to the present invention makes it possible to reduce a leakage current of a dielectric layer formed by the sol-gel method, the MOCVD method, or the sputtering deposition method and to efficiently manufacture materials for forming a capacitor layer having excellent dielectric characteristics. As a result, electronic and electrical equipment with lower price and high quality can be provided to the market.

The invention claimed is:

1. A material for forming a capacitor layer comprising a dielectric layer between a first conductive layer to be used for forming a top electrode and a second conductive layer to be used for forming a bottom electrode, characterized in that
    the dielectric layer is a dielectric oxide film formed by any one of a sol-gel method, an MOCVD method, and a sputtering deposition method; and a resin component are impregnated between particles constituting the dielectric oxide film.

2. The material for forming a capacitor layer according to claim 1, wherein the dielectric oxide film constituting the dielectric layer comprises 0.01 mol % to 5.00 mol % of one or more selected from manganese, silicon, nickel, aluminum, lanthanum, niobium, magnesium, and tin.

3. The material for forming a capacitor layer according to claim 1, wherein the dielectric layer has a thickness of 20-nano meter to 1-micron meter.

4. The material for forming a capacitor layer according to claim 1, wherein the dielectric oxide film is a $(Ba_{1-x} Sr_x)TiO_3$ ($0 <=x<=1$) film or a $BiZrO_3$ film.

5. The material for forming a capacitor layer according to claim 1, wherein the second conductive layer is a nickel layer or a nickel alloy layer having a thickness of 1-micron meter to 100-micron meter.

6. The material for forming a capacitor layer according to claim 5, wherein the nickel alloy layer is a nickel-phosphorus alloy.

7. A method for manufacturing the material for forming a capacitor layer according to claim 1, characterized in that
    the dielectric oxide film is formed on a surface of a material for forming the bottom electrode by any one of a sol-gel method, an MOCVD method, and a sputtering deposition method; a resin varnish is coated on a surface of the dielectric oxide film to be impregnated into the dielectric oxide film; the resin is dried and cured to form the dielectric layer; and then a material layer for forming a top electrode is provided on the dielectric layer.

8. The method for manufacturing the material for forming a capacitor layer according to claim 7, characterized by comprising the following processes (A) to (C) when a sol-gel method is applied for forming the dielectric oxide film,
    (A) a solution preparation process of preparing a sol-gel solution for manufacturing an aiming dielectric oxide film;
    (B) a coating process of adjusting a film thickness by repeating a unit step twice or more times where the unit step comprises a sequential stages: coating the sol-gel solution on a surface of a metal foil to be the second conductive layer followed by drying the solution in an oxygen-containing atmosphere at 120° C. to 250° C. for 30 seconds to 10 minutes followed by subjecting the dried solution to pyrolysis in an oxygen-containing atmosphere at 270° C. to 390° C. for 5 minutes to 30 minutes; and then
    (C) a baking process of conducting a baking treatment at 550° C. to 800° C. for 5 minutes to 60 minutes in an inert-gas substituted atmosphere or in a vacuum atmosphere to finish the dielectric layer.

9. The method for manufacturing the material for forming a capacitor layer according to claim 7, characterized by comprising the following processes (a) to (c) when a sol-gel method is applied for forming the dielectric oxide film, (a) a solution preparation process of preparing a sol-gel solution for manufacturing an aiming dielectric oxide film;

(b) a coating process of adjusting a film thickness by repeating a unit step twice or more times and conducting one or more pre-baking treatments among the unit steps wherein the unit step comprises a sequential stages: coating the sol-gel solution on a surface of a metal foil to be the second conductive layer followed by drying the solution in an oxygen-containing atmosphere at 120° C. to 250° C. for 30 seconds to 10 minutes followed by subjecting the dried solution to pyrolysis in an oxygen-containing atmosphere at 270° C. to 390° C. for 5 minutes to 30 minutes, and the pre-baking treatment is conducted at 550° C. to 800° C. for 2 minutes to 60 minutes in an inert-gas substituted atmosphere or in a vacuum atmosphere; and then (c) a baking process of conducting a baking treatment at 550° C. to 800° C. for 5 minutes to 60 minutes in an inert-gas substituted atmosphere or in a vacuum atmosphere to finish the dielectric layer.

10. The method for manufacturing the material for forming a capacitor layer according to claim 7, wherein the resin varnish coated on a surface of the dielectric oxide film is a dilute resin varnish having a solid content of 0.1 wt % to 1.0 wt % against 100 wt % weight of the resin varnish.

11. A printed wiring board comprising an embedded capacitor layer obtained by using the material for forming a capacitor layer according to claim 1.

* * * * *